(12) United States Patent
Arnott

(10) Patent No.: US 7,417,500 B2
(45) Date of Patent: Aug. 26, 2008

(54) CONTROL OF AN ADJUSTABLE GAIN AMPLIFIER

(75) Inventor: James Christopher Arnott, Santa Clara, CA (US)

(73) Assignee: Tzero Technologies, Inc., Sunnyvale, CA (US)

( * ) Notice: Subject to any disclaimer, the term of this patent is extended or adjusted under 35 U.S.C. 154(b) by 214 days.

(21) Appl. No.: 11/455,622

(22) Filed: Jun. 19, 2006

(65) Prior Publication Data

US 2007/0290746 A1    Dec. 20, 2007

(51) Int. Cl.
*H03F 3/217* (2006.01)

(52) U.S. Cl. .......................... 330/86; 330/282

(58) Field of Classification Search .............. 330/86, 330/129, 137, 278, 279, 282, 124 D; 455/127.2
See application file for complete search history.

(56) References Cited

U.S. PATENT DOCUMENTS

| | | | |
|---|---|---|---|
| 5,361,042 A * | 11/1994 | Gist | 330/261 |
| 6,081,162 A * | 6/2000 | Johnson | 330/301 |
| 6,169,638 B1 * | 1/2001 | Morling | 360/46 |
| 6,621,343 B2 | 9/2003 | Hart | |
| 7,035,351 B1 | 4/2006 | Park et al. | |

* cited by examiner

*Primary Examiner*—Robert J. Pascal
*Assistant Examiner*—Khiem D Nguyen
(74) *Attorney, Agent, or Firm*—Brian R. Short

(57) ABSTRACT

A method of controlling an adjustable gain of an amplifier is disclosed. The method includes setting an output of a replica amplifier to be equivalent to a precision reference with a control loop, summing an adjustable offset voltage into the control loop, adjusting the adjustable offset voltage until an error offset voltage of the control loop is nulled, and controlling the adjustable gain of the amplifier with an output of the control loop. An apparatus for controlling an adjustable gain of an amplifier is also disclosed. The apparatus includes a control loop for setting the adjustable gain. The control loop includes an adjustable gain replica amplifier. A switch receives an output of the replica amplifier and a precision reference. An error amplifier receives outputs from the switch and generates a control voltage. The control voltage controls an adjustable gain of the replica amplifier and the adjustable gain of the amplifier.

21 Claims, 7 Drawing Sheets

US 7,417,500 B2

CONTROL OF AN ADJUSTABLE GAIN AMPLIFIER

FIELD OF THE INVENTION

The invention relates generally to communication systems. More particularly, the invention relates to a method and apparatus for controlling an adjustable gain of a filter amplifier.

BACKGROUND OF THE INVENTION

Transceivers of communication systems typically include base-band amplifiers and filters. The base-band amplifiers and filters amplify and filter communication signals before or after transmission. The performance required by the amplifiers and filters is generally determined by the type of wireless communication being supported by the transceivers.

FIG. 1 shows a general prior art receiver chain of a wireless transceiver. An equivalent transmitter chain typically requires equivalent components as the receiver chain. The receiver chain includes an antenna 110, an LNA (low noise amplifier) 120, a frequency mixer 130 an associated LO (local oscillator) signal, a base-band filter 140 and a VGA (variable gain amplifier) 150. As previously stated, the performance required of the receiver chain components is typically determined by the type of wireless communication of the transceiver.

UWB (ultra wide-band) is an evolving wireless communication standard. The Federal Communications Committee (FCC) has mandated that UWB radio transmission can legally operate in the frequency range of 3.1 GHz to 10.6 GHz, at a transmission power of −41.25 dBm/MHz, having a minimum bandwidth of 528 MHz. Basically, UWB devices provide wide bandwidth transmission at very low signal power levels.

The base-band filter 140 of a UWB transceiver should support, for example, a pass-band of over 528 MHz. Additionally, the base-band filter needs to satisfy linearity, and out-of-channel rejection requirements as specified by UWB transmission. Due to the high-bandwidth requirements of UWB, the base-band filter is more susceptible to inter-modulation caused by amplifier non-linearities.

Discrete or integrated component passive filters having a pass-band of over 528 MHz are prohibitively large and lossy. That is the inductors, capacitors and resistor required to implement a 528 MHz pass-band filter are physically too large and lossy to be implemented or integrated in a UWB transceiver. Presently, active filters are difficult to design having 528 MHz pass-bands. Operational amplifiers of active filters need to have operational bandwidths that are substantially greater than the bandwidths required by the active filters. Therefore, for very large bandwidth active filters the bandwidth of the operational amplifier can be difficult to achieve.

It is desirable have a method and apparatus for providing a wide-bandwidth amplifier that is very linear and provides high out-of-channel rejection.

SUMMARY OF THE INVENTION

Embodiments of the invention include wide-bandwidth amplifiers that can be used within active filters to provide base-band filtering for UWB transceivers. The wide-band amplifiers include a open-loop amplifier having an adjustably controllable gain.

An embodiment of the invention includes a method of controlling an adjustable gain of an amplifier. The method includes setting an output of a replica amplifier to be equivalent to a precision reference with a control loop, summing an adjustable offset voltage into the control loop, adjusting the adjustable offset voltage until an error offset voltage of the control loop is nulled, and controlling the adjustable gain of the amplifier with an output of the control loop.

Another embodiment of the invention includes an apparatus for controlling an adjustable gain of an amplifier. The apparatus includes a control loop for setting the adjustable gain. The control loop includes an adjustable gain replica amplifier. A switch receives an output of the replica amplifier and a precision reference. An error amplifier receives outputs from the switch and generates a control voltage. The control voltage controls an adjustable gain of the replica amplifier and the adjustable gain of the amplifier.

Other aspects and advantages of the present invention will become apparent from the following detailed description, taken in conjunction with the accompanying drawings, illustrating by way of example the principles of the invention.

DETAILED DESCRIPTION

The invention includes a wide-band amplifier that can be included within an active filter. The gain of the active filter is controlled by a control loop that includes a replica amplifier.

Figure 1:
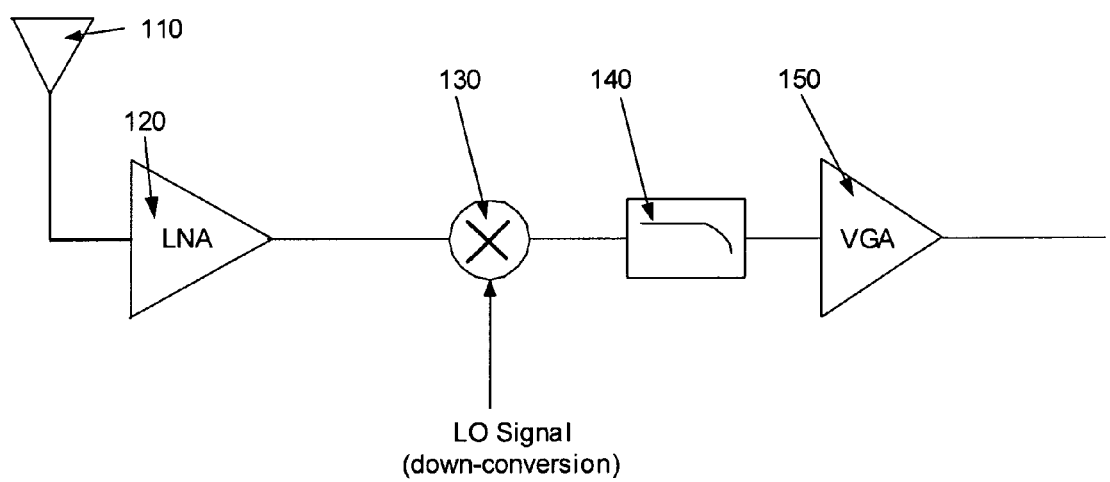
FIG. 1 shows a prior art transceiver that includes a base-band filter amplifier.
Figure 2:
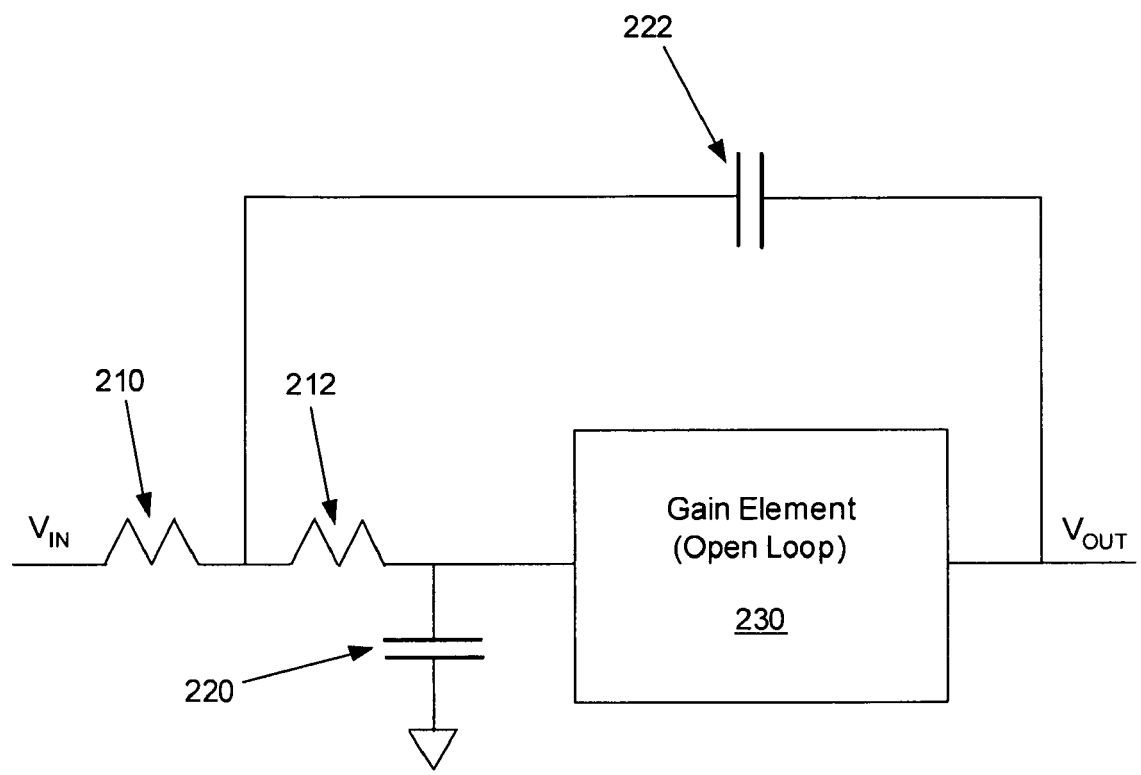
FIG. 2 shows an open-loop Sallen-Key active filter.

FIG. 2 shows an open-loop amplifier Sallen-Key active filter. This particular Sallen-Key active filter is a second order filter that includes resistors 210, 212 and capacitors 220, 222. The resistors 210, 212, capacitors 220, 222 and a gain of an amplifier 230 determine the frequency response of the active filter. A Sallen-Key active filter is a desirable filter design because Sallen-Key filters tend to be very linear compared to other filter designs. However, other filter designs can be used as well.

A low frequency Sallen-Key active filter can be designed with an operational amplifier. However, operational amplifiers are difficult to design for an active filter having very high-frequency pass-bands. Operational amplifiers are bandwidth limited which in turn limits the bandwidths of active filters designed using operational amplifiers.

An embodiment of the active filter includes an open-loop amplifier 230. Open-loop amplifiers provide much greater bandwidths than closed-loop amplifiers. However, open-loop amplifiers are not very well controlled. More specifically, the gain of open-loop amplifiers amplifier can vary greatly. The Q of an active filter is very dependent upon the gain of the amplifier or gain element within the active filter. In turn, the transfer function of the active filter is very dependent upon the Q of the active filter. The sensitivity of the Q of the active filter with respect to the gain of the amplifier of the active filter can cause the frequency response of the transfer function of the active filter to excessively peak or droop.

Figure 3:
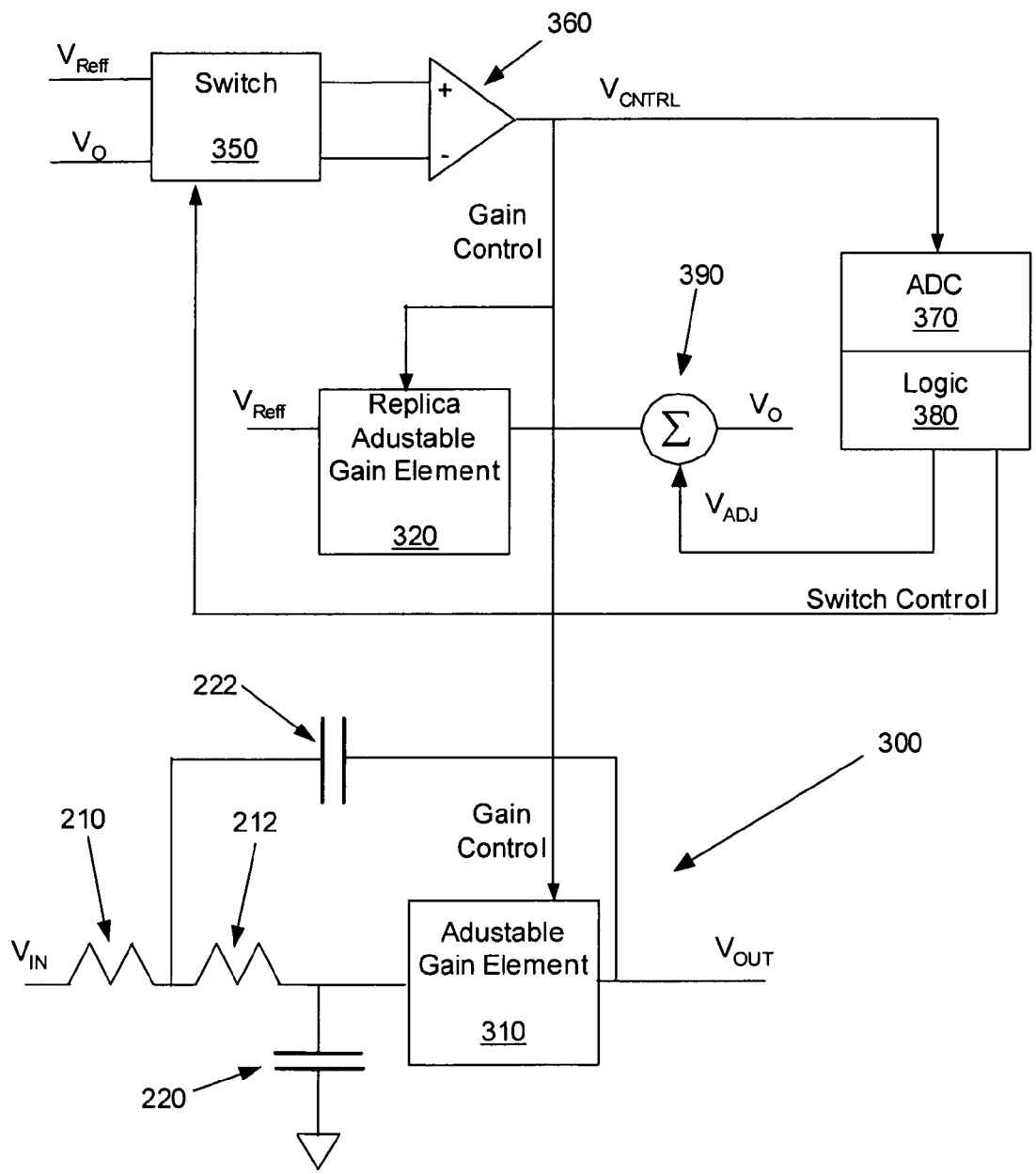
FIG. 3 shows an example of a wide-band filter amplifier that has a constant gain.

FIG. 3 shows an example of a wide-band filter amplifier 300 that has a constantly controlled gain. Essentially, the embodiment of FIG. 3 includes an adjustable amplifier 310 that includes control circuitry for ensuring that the gain of the amplifier 310 is controlled, and therefore, does not vary excessively. The gain is more stable and well-behaved than the amplifier would be without the gain control.

The control circuitry includes a replica amplifier 320. If the replica amplifier 320 is located on the same substrate as the amplifier 310, the replica amplifier 320 experiences substantially the same process and environmental variations as the amplifier 310. Therefore, gain variations of the amplifier 310 due to processing and environmental variations can be compensated and mitigated by the control circuitry of the replica amplifier 320. The replica amplifier 320 can be formed as a scaled version of the amplifier 310. Forming the replica amplifier 320 as a scaled-down version of the amplifier 310 can be advantageous due to a reduction in substrate area and power dissipation. Additionally, the scaled-down version conducts less current.

The control circuitry of the embodiment of FIG. 3 is a control loop that includes the replica amplifier 320. One embodiment of the replica amplifier 320 is designed to have identical, or near-identical characteristics as the amplifier 310. Another embodiment of the replica amplifier 320 is a scaled version of the amplifier 310. As previously stated, the error offset voltage of the replica amplifier 320 varies due to processing variations during the formation of the replica amplifier 320. Additionally, the error offset voltage and gains of the amplifiers 310, 320 can vary due to environmental effects, such as, temperature variations and power supply variations. The control loop in combination with the replica amplifier 320, minimizes the effects of both processing variations, and the environment on the gain of the amplifier 310.

The control loop receives a precision reference ($V_{REF}$) and forces an output ($V_O$) of the replica amplifier to be equivalent to $V_{REF}$. The exemplary embodiment of FIG. 3 includes an error amplifier 360 which provides a comparative output ($V_{CONTL}$) between $V_{REF}$ and $V_O$. $V_{CONTL}$ drives the gain control of the replica amplifier 320, setting the equivalence between $V_{REF}$ and $V_O$. If the gain of the replica amplifier is one (unity), then $V_O$ will be forced to being approximately equal to $V_{REF}$. If the replica amplifier 320 has a gain that is not unity, then the equivalence between $V_{REF}$ and $V_O$ will scale according to the gain of the replica amplifier 320.

An adjustable offset voltage ($V_{ADJ}$) is summed into the control loop. The adjustable offset voltage (designated 390) can be summed, for example, at the output of the replica amplifier 320. $V_{ADJ}$ is adjusted to cancel offset errors of the replica amplifier 320.

The output ($V_{CONTL}$) of the high-gain error amplifier 360 is also received by a logic control 380 after being converted to a digital value by an ADC 370. The logic control 380 controls the setting of the adjustable offset voltage ($V_{ADJ}$). The logic control 380 also controls the setting of a switch 350 that controls the $V_{REF}$, $V_O$ inputs to the error amplifier 360.

For an embodiment, the precision reference $V_{REF}$ is selected to ensure that a common mode voltage of the amplifier 310 is equivalent to a common mode voltage of the replica amplifier 320. The common mode voltages are set by a separate feedback loop that monitors the common mode voltage of the amplifier 310 and forces the common mode voltage of the replica amplifier 320 to be the same. $V_{REF}$ can be initially determined through simulation in which $V_{REF}$ is selected so that the gain of the amplifier 310 is, for example, one. The separate feedback loop continuously samples the common mode voltage of the amplifier 310 and applies this common mode voltage to $V_{REF}$, forcing the common mode voltages of the amplifiers 310, 320 to be the same. That is, $V_{REF}$ is set to the initial value and then updated by the separate feedback loop until the common mode voltages are forced to be equivalent.

The output of a replica amplifier 320 is set to be equivalent to the precision reference $V_{REF}$ by the control loop adjusting a gain of the replica amplifier 320 so that the output of the replica amplifier 320 is equivalent to the precision reference $V_{REF}$. The precision reference $V_{REF}$ may be scaled according to the gain of the replica amplifier 320.

The adjustable offset voltage ($V_{ADJ}$) is summed into the control loop to cancel offset voltage errors within the replica amplifier 320 and the control loop. An example of a method of adjusting the $V_{ADJ}$ includes first detecting a sign (plus or minus) of the adjustable offset voltage relative to the error offset voltage. The adjustable offset voltage is then summed or subtracted depending upon the sign determination. The adjustable offset voltage is then adjusted until the control voltage $V_{CONTL}$ stabilizes. The switch 350 is switched back in forth with time until the output ($V_{CONTL}$) of the error amplifier 360 is stable, suggesting that the $V_{REF}$ and $V_O$ inputs to the error amplifier 360 are equivalent, and the error offset is cancelled. If $V_{CONTL}$ is not longer changing while the switch 350 is changing states, then the offset voltage errors have been properly cancelled.

The period and duration of the switch settings is selected based on a desired calibration time, and the response time of the control loop.

Figure 4:
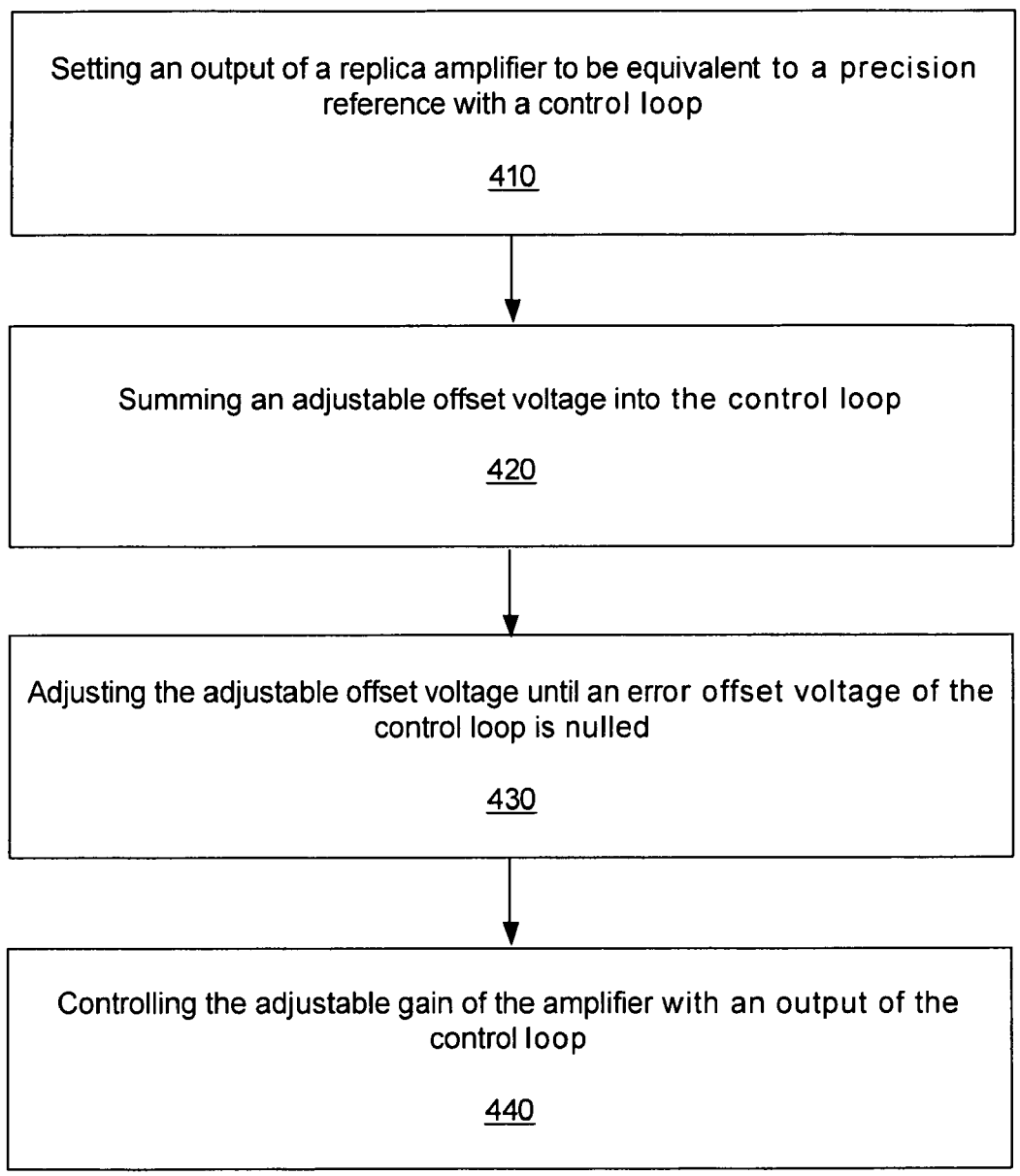
FIG. 4 is a flow chart that shows steps of an example of a method of controlling an adjustable gain of a filter amplifier.

FIG. 4 is a flow chart that shows steps of an example of a method of controlling an adjustable gain of an amplifier. A first step 410 of the method includes setting an output of a replica amplifier to be equivalent to a precision reference with a control loop. A second step 420 includes summing an adjustable offset voltage into the control loop. A third step 430 includes adjusting the adjustable offset voltage until an error offset of the control loop is nulled. A fourth step 440 includes controlling the adjustable gain of the amplifier with an output of the control loop.

One example of a method of summing and adjusting the adjustable offset voltage includes detecting a sign (relative to the error offset voltage) and summing the adjustable offset voltage accordingly. That is, the adjustable offset is summed in a direction that reduces the effects of the error offset voltage. The adjustable offset voltage is then adjusted until the output of the control loop converges on a stable, final value.

As previously described, an embodiment includes the amplifier and the replica amplifier being open-loop amplifiers. The filter-amplifier configuration as shown in FIG. 3 includes a feedback capacitor 222. However, this configuration is generally considered an open-loop amplifier because the gain is not stabilized by the feedback loop. The amplifier and the replica amplifier can include predetermined common characteristics, such as, the amplifier and the replica amplifier can be formed on a common substrate and implemented with substantially identical electronic circuitry.

An embodiment of the control loop includes a switch (such as switch 350) that receives the precision reference and the output of the replica amplifier. An error amplifier receives outputs of the switch, and drives the adjustable gain control of the replica amplifier. The error offset of the control loop is nulled by adjusting the adjustable offset voltage while switching the switch until the output of the control loop is stable. An embodiment includes the adjustable offset voltage being summed at the output of the replica amplifier.

As described and shown in FIG. 3, an example of the control loop further includes control logic for receiving an output of the error amplifier, and controlling settings of the switch. The settings of the switch are used to determine how to adjust the adjustable offset voltage as previously described.

As previously described, the precision reference voltage is selected to ensure that a common mode voltage of the amplifier is equivalent to a common mode voltage of the replica amplifier. The precision reference voltage is initially selected, and can be updated with a separate control loop to force the common mode voltage of the amplifier to be equivalent to the common mode voltage of the replica amplifier.

Figure 5:
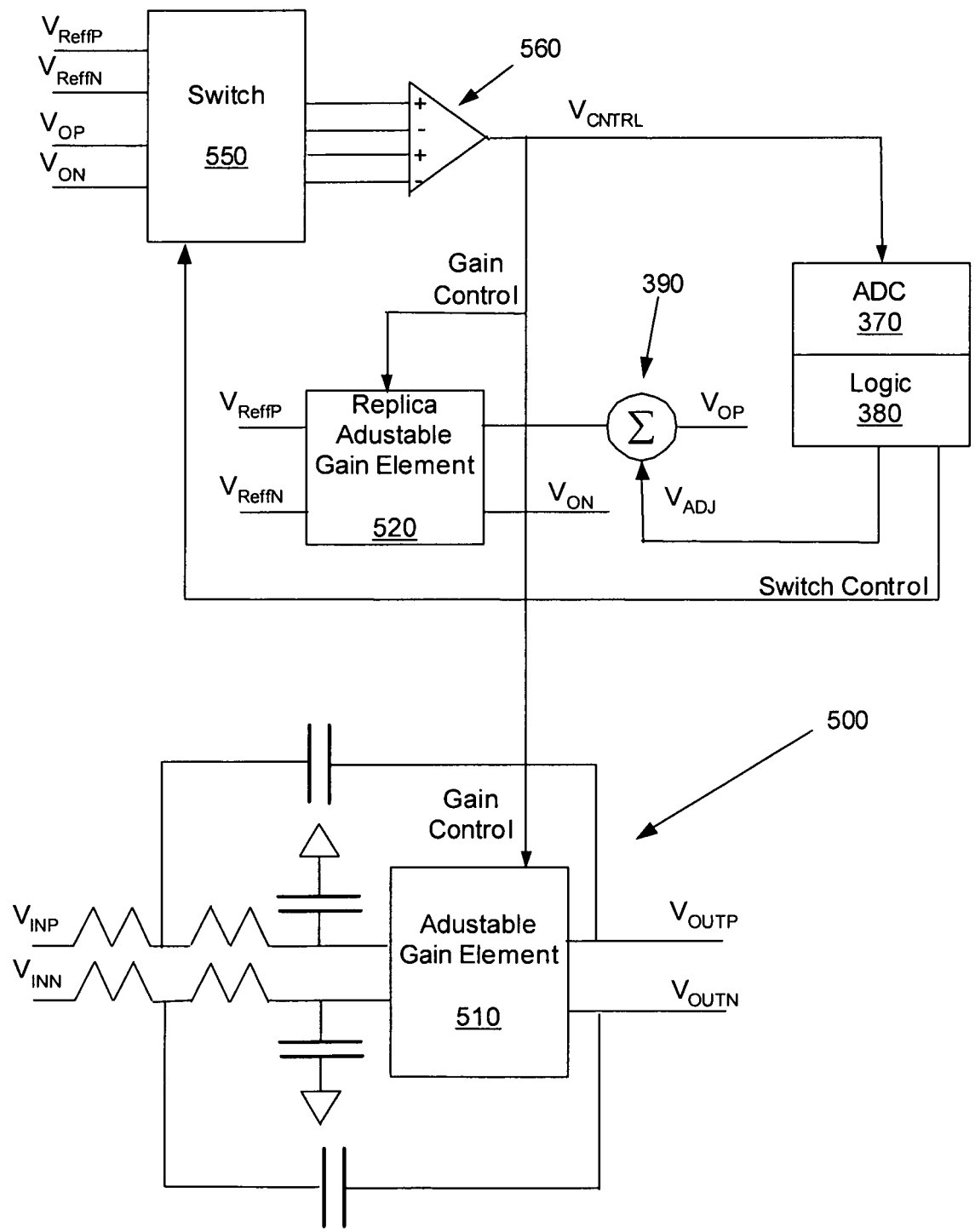
FIG. 5 shows another example of a wide-band filter amplifier that has a constant gain.

FIG. 5 shows another example of a wide-band filter amplifier that has a constant gain. This exemplary embodiment includes a controllable gain amplifier having differential inputs. The inclusion of differential inputs provides better power supply and noise rejection than the single-input amplifier of FIG. 3.

The adjustable gain amplifier 510 includes differential inputs $V_{INP}$ and $V_{INN}$, and generates filtered outputs $V_{OUTP}$ and $V_{OUTN}$. As previously described, the gain of the amplifier 510 is controlled by a control loop that includes a replica amplifier 520. As shown in FIG. 5, the replica amplifier 520 includes differential inputs $V_{RefP}$ and $V_{RefN}$, and generates differential outputs $V_{OP}$ and $V_{ON}$. The switch 550 provides switch control of the inputs of a differential error amplifier 560. Other than including differential signals, the amplifier 510 and control loop of FIG. 5 operate in very much the same way as the amplifier 310 and control loop of FIG. 3.

The physical sizes of the amplifier 510 and the replica amplifier 520 can be scaled. Physically scaling the amplifiers 510, 520 can be used to scale the gains of the amplifiers 510, 520.

Figure 6:
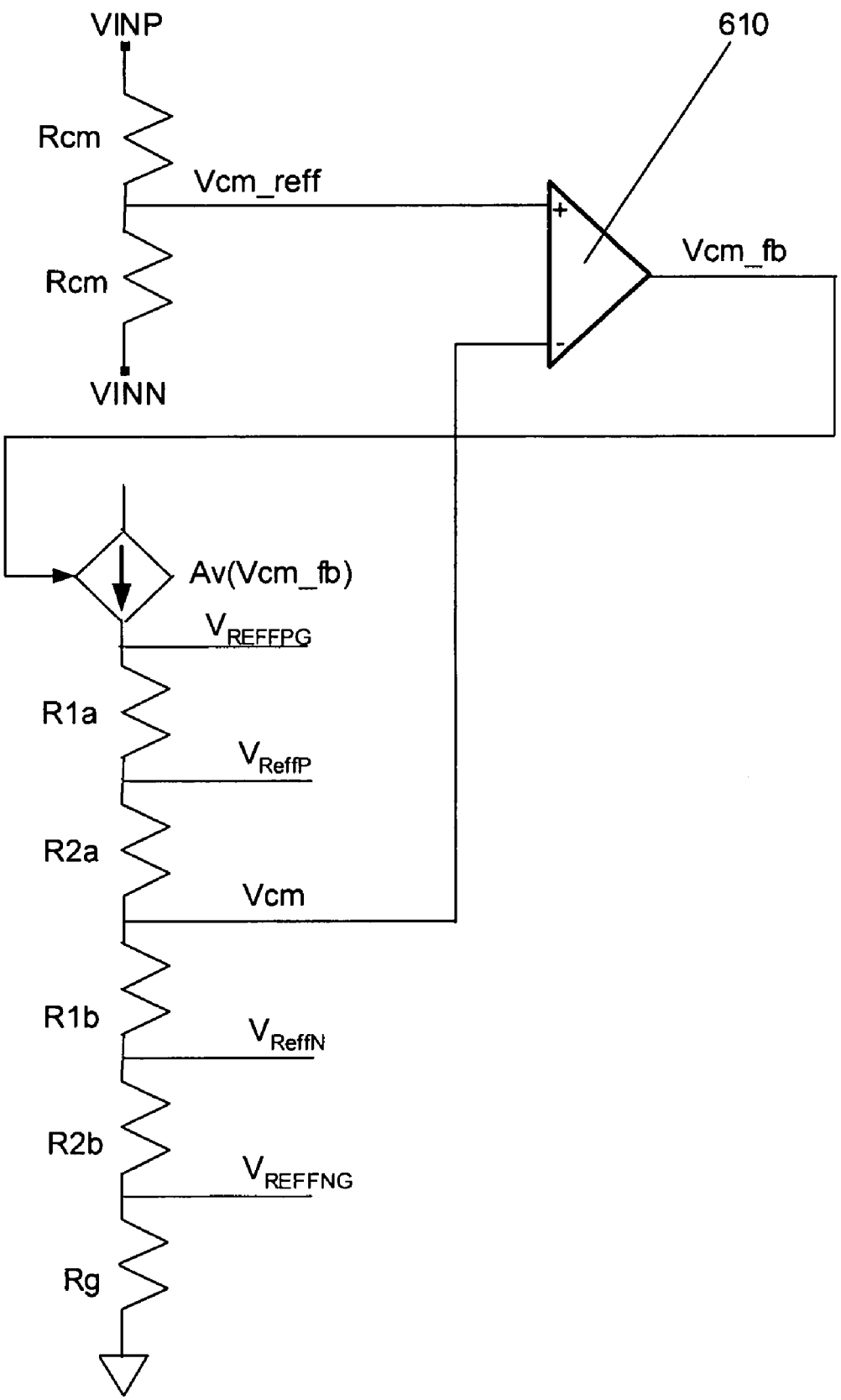
FIG. 6 shows a reference voltage generator that can be used to generate the reference voltages of FIG. 5.

FIG. 6 shows a reference voltage generator that can be used to generate the reference voltages $V_{RefP}$ and $V_{RefN}$ of FIG. 5. The reference voltage generator forces the common mode voltages of the amplifier 510 and the replica amplifier 520 to be equivalent. The reference voltage generator shown in FIG. 6 is for the general case where the gain of the replica amplifier 520 is greater than one. For the case where the gain is one, the resistors R1a and R2b are eliminated (shorted), making the $V_{RefP}$ and $V_{RefN}$ reference voltages equal to the $V_{REFFPG}$ and $V_{REFFNG}$ reference voltages. For the case where the gain is greater than one, the $V_{RefP}$ and $V_{RefN}$ inputs to the switch 550 are replaced with the reference voltages $V_{REFFPG}$ and $V_{REFFNG}$.

A pair of common mode resistors Rcm generate a common mode reference voltage Vcm_reff from the inputs $V_{INP}$, $V_{INN}$ of the amplifier 510. A resistive voltage divider network including R1a, R2a, R1b, R2b, Rg generates a common mode voltage Vcm. The common mode reference voltage Vcm_reff and the common mode voltage Vcm are connected to a feedback amplifier 610, generating a common mode feedback voltage Vcm_fb. The common mode feedback voltage Vcm_fb controls a current source Av(Vcm_fb), which in turn adjusts the common mode voltage Vcm and the reference voltages $V_{RefP}$, $V_{RefN}$, $V_{REFFPG}$, and $V_{REFFNG}$.

The resistor Rg has a resistance that is substantially greater than the resistance of R1a and R2a. The gain of the replica amplifier is approximately R1a/R2a when R2a is not shorted and the gain of the replica amplifier is greater than one. Typically, the resistance of R1a is approximately equal to the resistance of R1b, and the resistance of R2a is approximately equal to the resistance of R2b. The gain of the replica amplifier is approximately one when R1a is shorted (zero resistance).

It is to be understood that the replica amplifier and associated control loop can be used to control the adjustable gain of more than one amplifier.

Figure 7:
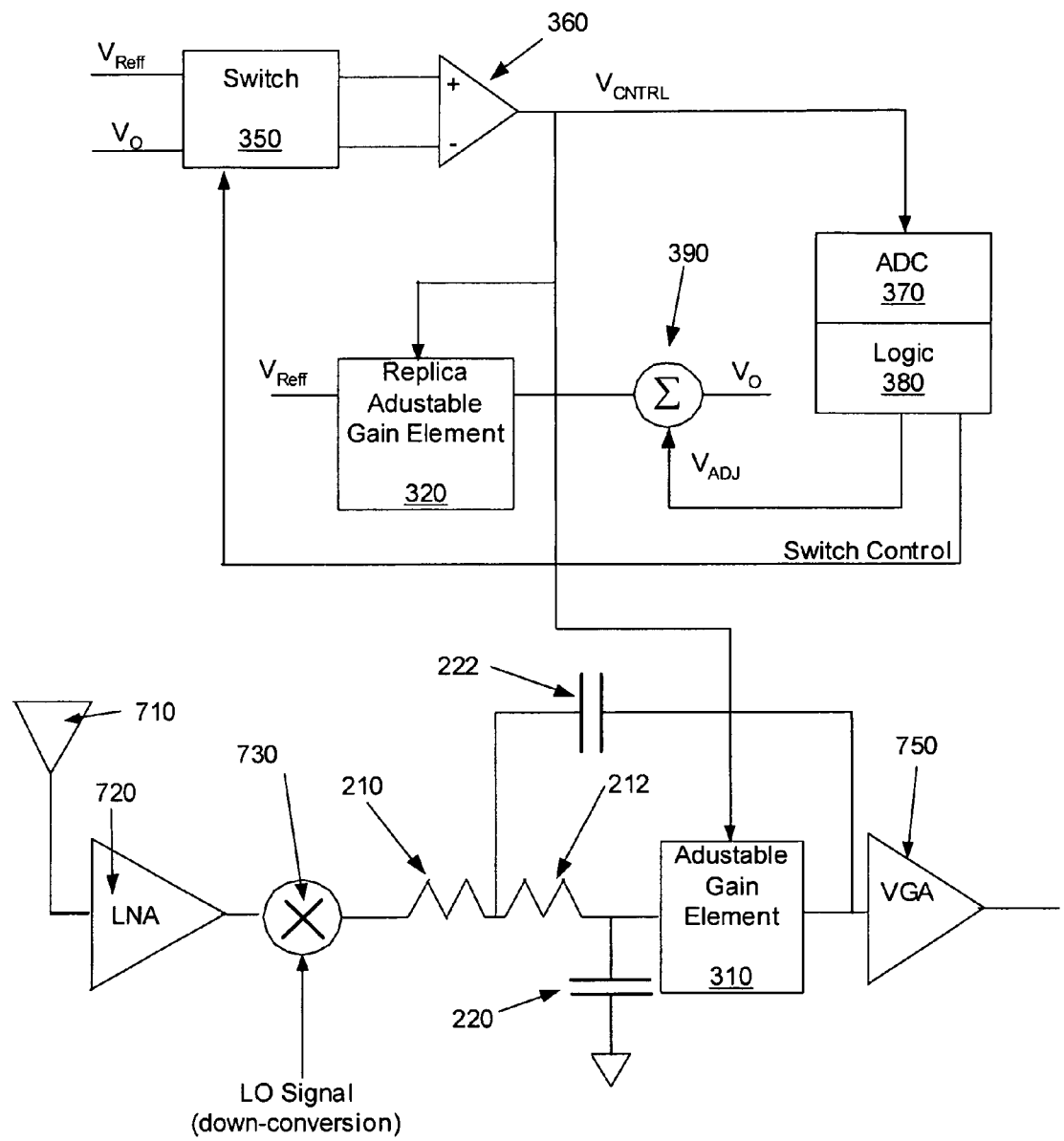
FIG. 7 shows an example of a transceiver chain that includes a wide-band filter amplifier that has a constant gain.

FIG. 7 shows an example of a receiver chain that includes a wide-band filter amplifier that has a constant gain. The receiver can be included within a transceiver that includes a functionally similar transmitter chain. The receiver chain includes an antenna 710, an LNA (low noise amplifier) 720, a frequency mixer 730 an associated LO (local oscillator) signal, a base-band filter and a VGA (variable gain amplifier) 750.

The base-band filter is implemented with the amplifier and control loop of FIG. 3. The amplifier and control loop of FIG. 5 could just as easily have been used. As noted above. The amplifier and control loop embodiments can be used within a transmitter as a base-band filter as well.

Although specific embodiments of the invention have been described and illustrated, the invention is not to be limited to the specific forms or arrangements of parts so described and illustrated. The invention is limited only by the appended claims.

What is claimed:

1. A method of controlling an adjustable gain of an amplifier, comprising:
    setting an output of a replica amplifier to be equivalent to a precision reference with a control loop;
    summing an adjustable offset voltage into the control loop;
    adjusting the adjustable offset voltage until an error offset voltage of the control loop is nulled; and
    controlling the adjustable gain of the amplifier with an output of the control loop.

2. The method of claim 1, wherein at least one of the amplifier and the replica amplifier are open-loop amplifiers.

3. The method of claim 1, wherein the replica amplifier is a scale-down version of the amplifier.

4. The method of claim 1, wherein the amplifier and the replica amplifier have predetermined common characteristics.

5. The method of claim 4, wherein the predetermined common characteristics comprises the amplifier and the replica amplifier being formed on a common substrate and implemented with substantially identical electronic circuitry.

6. The method of claim 1, wherein a gain of the replica amplifier is scaled relative to the amplifier.

7. The method of claim 1, wherein the control loop comprises:
    a switch that receives the precision reference and the output of the replica amplifier;
    an error amplifier that receives outputs of the switch, and drives an adjustable gain control of the replica amplifier.

8. The method of claim 7, wherein adjusting the adjustable offset voltage until an error offset voltage of the control loop is nulled comprises adjusting the adjustable offset voltage while switching the switch until the output of the control loop is stable.

9. The method of claim 7, wherein the control loop further comprises control logic for receiving an output of the error amplifier, and controlling settings of the switch.

10. The method of claim 1, wherein the adjustable offset voltage is summed at the output of the replica amplifier.

11. The method of claim 1, wherein setting an output of a replica amplifier to be equivalent to a precision reference includes scaling the precision reference with a gain of the replica amplifier.

12. The method of claim 1, wherein setting an output of a replica amplifier to be equivalent to a precision reference with a control loop comprises the control loop forcing the output of the replica amplifier to be equivalent to the precision reference by adjusting a gain of the replica amplifier.

13. The method of claim 1, wherein the precision reference voltage is selected to ensure that a common mode voltage of the amplifier is equivalent to a common mode voltage of the replica amplifier.

14. The method of claim 1, further comprising controlling the adjustable gain of a second amplifier with an output of the control loop.

15. An apparatus for controlling an adjustable gain of an amplifier, comprising:
   a control loop for setting the adjustable gain, the control loop comprising;
      an adjustable gain replica amplifier;
      a switch that receives an output of the replica amplifier and a precision reference;
      a error amplifier that receives outputs from the switch and generates a control voltage; wherein
      the control voltage controls an adjustable gain of the replica amplifier and the adjustable gain of the amplifier.

16. The apparatus of claim 15, wherein the control loop further comprises an adjustable offset voltage that is summed with the output of the replica amplifier for canceling a error offset voltage of the replica amplifier.

17. The apparatus of claim 15, further comprising control logic that receives the control voltage and sets the switch.

18. The apparatus of claim 15, wherein the precision reference voltage is selected to ensure that a common mode voltage of the amplifier is equivalent to a common mode voltage of the replica amplifier.

19. The apparatus of claim 15, wherein the adjustable offset voltage is adjusted while switching the switch until the output of the control loop is stable, nulling an error offset voltage of the control loop.

20. The apparatus of claim 15, wherein the amplifier and the replica amplifier are open-loop amplifiers.

21. A UWB transceiver comprising a base-band amplifier, the base-band amplifier comprising:
   a control loop for setting an adjustable gain of the base-band amplifier, the control loop comprising;
      an adjustable gain replica amplifier;
      a switch that receives an output of the replica amplifier and a precision reference;
      a error amplifier that receives outputs from the switch and generates a control voltage; wherein
      the control voltage controls an adjustable gain of the replica amplifier and the adjustable gain of the base-band amplifier.

* * * * *